US006891749B2

(12) United States Patent
Campbell et al.

(10) Patent No.: US 6,891,749 B2
(45) Date of Patent: May 10, 2005

(54) RESISTANCE VARIABLE 'ON' MEMORY

(75) Inventors: Kristy A. Campbell, Boise, ID (US); John T. Moore, Boise, ID (US); Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 184 days.

(21) Appl. No.: 10/077,872

(22) Filed: Feb. 20, 2002

(65) Prior Publication Data

US 2003/0156468 A1 Aug. 21, 2003

(51) Int. Cl.$^7$ .............................................. G11C 11/00

(52) U.S. Cl. ........................ 365/163; 365/148; 365/113; 365/114; 365/100; 257/2

(58) Field of Search ................................ 365/163, 148, 365/113, 114

(56) References Cited

U.S. PATENT DOCUMENTS

| | | | |
|---|---|---|---|
| 3,271,591 A | | 9/1966 | Ovshinsky |
| 3,622,319 A | | 11/1971 | Sharp |
| 3,743,847 A | | 7/1973 | Boland |
| 3,803,508 A | * | 4/1974 | Shaw ........................ 331/58 |
| 3,961,314 A | | 6/1976 | Klose et al. |
| 3,966,317 A | | 6/1976 | Wacks et al. |
| 3,983,076 A | * | 9/1976 | Rockstad et al. ........ 252/519.4 |
| 3,988,720 A | | 10/1976 | Ovshinsky |
| 3,983,542 A | | 11/1976 | Ovshinsky |
| 4,177,474 A | | 12/1979 | Ovshinsky |
| 4,267,261 A | | 5/1981 | Hallman et al. |
| 4,269,935 A | | 5/1981 | Masters et al. |
| 4,272,562 A | * | 6/1981 | Wood ........................ 438/483 |

(Continued)

FOREIGN PATENT DOCUMENTS

| | | |
|---|---|---|
| JP | 56126916 | 10/1981 |
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Axon Technologies Corporation, Technology Description: *Programmable Metalization Cell(PMC)*, pp. 1–6 (Pre–May 2000).

Helbert et al., Intralevel hybrid resist process with submicron capability, SPIE vol. 333 Submicron Lithography, pp. 24–29 (1982).

Hilt, Dissertation: *Materials characterization of Silver Chalcogenide Programmable Metalization Cells*, Arizona State University, pp. Title page–114 (UMI Company, May 1999).

(Continued)

*Primary Examiner*—Viet Q. Nguyen
(74) *Attorney, Agent, or Firm*—Dickstein Shapiro Morin & Oshinsky LLP

(57) ABSTRACT

A resistance variable memory element and method for stabilizing the resistance variable memory element by providing a first and second electrode connected to a resistance variable material whereby the first and second electrodes comprise materials capable of providing a differential electrochemical potential across the resistance variable memory element which causes the resistance variable memory element to write to a predetermined "on" state. The resistance variable memory element is stabilized in a low resistance "on" state by the differential electrochemical potential. The first electrode preferably is a platinum electrode and the second electrode is preferably a silver electrode. The method and circuitry further includes a reverse refresh for stabilizing the resistance variable memory element in a high resistance state by applying a reverse voltage to the memory element.

77 Claims, 4 Drawing Sheets

U.S. PATENT DOCUMENTS

| | | |
|---|---|---|
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,433,342 A * | 2/1984 | Patel et al. .................... 257/2 |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,876,668 A * | 10/1989 | Thakoor et al. ............ 365/163 |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,825,046 A | 10/1998 | Czubatyj et al. |
| 5,837,564 A | 11/1998 | Sandhu et al. |
| 5,841,150 A | 11/1998 | Gonzalez et al. |
| 5,846,889 A | 12/1998 | Harbison et al. |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,072,716 A * | 6/2000 | Jacobson et al. ........... 365/163 |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,423,628 B1 | 7/2002 | Li et al. |
| 6,429,064 B1 | 8/2002 | Wicker |
| 6,437,383 B1 | 8/2002 | Xu |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowrey |
| 6,507,061 B1 | 1/2003 | Hudgens et al. |
| 6,511,862 B2 | 1/2003 | Hudgens et al. |
| 6,511,867 B2 | 1/2003 | Lowrey et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 | 4/2003 | Chiang |
| 6,545,907 B1 | 4/2003 | Lowery et al. |
| 6,555,860 B2 | 4/2003 | Lowery et al. |
| 6,563,164 B2 | 5/2003 | Lowery et al. |
| 6,566,700 B2 | 5/2003 | Xu |
| 6,567,293 B1 | 5/2003 | Lowery et al. |
| 6,569,705 B2 | 5/2003 | Chiang et al. |
| 6,570,784 B2 | 5/2003 | Lowery |
| 6,576,921 B2 | 6/2003 | Lowery |
| 6,586,761 B2 | 7/2003 | Lowery |
| 6,589,714 B2 | 7/2003 | Maimon et al. |
| 6,590,807 B2 | 7/2003 | Lowery |
| 6,593,176 B2 | 7/2003 | Dennison |
| 6,597,009 B2 | 7/2003 | Wicker |
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowrey et al. |
| 6,642,102 B2 | 11/2003 | Xu |
| 6,646,297 B2 | 11/2003 | Dennison |
| 6,649,928 B2 | 11/2003 | Dennison |

| | | |
|---|---|---|
| 6,667,900 B2 | 12/2003 | Lowery et al. |
| 6,671,710 B2 | 12/2003 | Ovshinsky et al. |
| 6,673,700 B2 | 1/2004 | Dennison et al. |
| 6,674,115 B2 | 1/2004 | Hudgens et al. |
| 6,687,153 B2 | 2/2004 | Lowery |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowery |
| 6,714,954 B2 | 3/2004 | Ovshinsky et al. |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0168820 A1 | 11/2002 | Koxicki et al. |
| 2002/0190350 A1 | 12/2002 | Kozicki |
| 2003/0027416 A1 | 2/2003 | Moore |
| 2003/0035314 A1 | 2/2003 | Kozicki |
| 2003/0035315 A1 | 2/2003 | Kozicki |
| 2003/0047765 A1 * | 3/2003 | Campbell .................. 257/298 |
| 2003/0048744 A1 | 3/2003 | Ovshinsky et al. |
| 2003/0117831 A1 * | 6/2003 | Hush ........................ 365/148 |
| 2003/0137869 A1 | 7/2003 | Kozicki |
| 2003/0146427 A1 * | 8/2003 | Campbell ...................... 257/2 |
| 2003/0155589 A1 * | 8/2003 | Campbell et al. ........... 257/225 |
| 2003/0156468 A1 * | 8/2003 | Campbell et al. ........... 365/200 |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

OTHER PUBLICATIONS

Hirose et al., High Speed Memory Behavior and Reliability of an Amorphous $As_2S_3$ Film Doped Ag. Phys. Stat. Sol. (a) 61, pp. 87–90 (1980).

Holmquist et al., Reaction and Diffusion in Silver–Arsenic Chalcogenide Glass Systems, 62 J. Amer. Ceram. Soc., No. 3–4, pp. 183–188 (Mar.–Apr. 1979).

Huggett et al., Development of silver sensitized germanium selenide photoresist by reactive sputter etching in $SF_6$, 42 Appl. Phys. Lett., No. 7, pp. 592–594 (Apr. 1983).

Kawaguchi et al., Mechanism of photosurface deposition, 164–166 J. Non–Cryst. Solids, pp. 1231–1234 (1993).

Kobolov and Elliott, Photodoping of Amorphous Chalcogenides by Metals, Advances in Physics, vo. 40, No. 5, 625–684 (1991).

Kozicki, et al., "Applications of Programmable Resistance Changes in Metal–doped Chalcogenides", Proceedings of the 1999 Symposium on Solid State Ionic Devices, Editors—E.D. Wachsman et al., The Electrochemical Society, Inc., 1–12 (1999).

Kozicki et al., Nanoscale effects in devices based on chalcogenide solid solutions, Engineering, vol. 63/1–3, 155–159 (2002).

Kozicki, et al., Nanoscale phase separation in Ag—Ge—Se glasses, Microelectric Engineering, vol. 63/1–3, 155–159 (2002).

M.N. Kozicki and M. Mikova, Silver incorporation in thin films of selenium rich Ge—SE glasses, Proceedings of the XIX International Congress on Glass, Society for Glass Technology, 226–227 (2001).

M.N. Kozicki and M. Mitkova, Silver incorporation in thin films of selenium rich Ge—Se glasses, Proceedings of the XIX International Congress on Glass, Society for Glass Technology, 226–227 (2001).

McHardy et al., The dissolution of metals in amorphous chalcogenides and the effects o electron and ultraviolet radiation, 20 J. Phys. C.: Solid State Phys., pp. 4055–4075 (1987)f.

Owen et al., Metal–Chalcogenide Photoresists for High Resolution Lithography and Sub–Micron Structures, Nanostructure Physics and Fabrication, pp. 447–451 (M. Reed ed. 1989).

Shimizu et al., The Photo–Erasable Memory Switching Effect of Ag Photo–Doped Chalcogenide Glasses, 46 B. Chem. Soc. Japan, No. 12, pp. 3662–3365 (1973).

M. Mitkova et al.—"Dual Chemical Role of Ag as an Additive in Chalcogenide Glasses" Physical Review Letters, vol. 83, No. 19, Nov. 8, 1999, pp. 3848–3851.

M. Mitkova, et al.—"Dual Chemical Role of Ag as an Additive in Chalcogenide Glasses" Physical Review Letters, vol. 83, No. 19, Nov. 8, 1999, pp. 3848–3851.

Abdel–Ali, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi, M.A.; Labib, H.H.; Fouad, S.S.; El–Shazly, A.A. Electrical and thermal conductivity of the amorphous semiconductor GexSe1–x, Egypt, J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range order, and ionic conductivity in superionic glasses, Solid state ionics 136–137 (2000) 1085–1089.

Asahara, Y.; Izumitani, T., Voltage controlled switching in Cu—As—Se compositions, J. Non–Cryst. Solids 11 (1972)97–104.

Asokan, S.; Prasad, M.V.N.; Parathasarathy, G.; Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism in ionic glasses, J. Chem. Phys. 111 (1999) 7546–7557.

Belin, R.; Taillaldes, G.; Pradel, A.; Ribes, M., Ion dynamics in superionic chalcogenide glasses: complete conductivity spectra, Solid state ionics 136–137 (2000) 1025–1929.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M—Ag2Se—M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S– to N–typ differential negative resistance in Al—Al2O3—Ag2–xSe1+ x thin film structures, Phys. Stat. Sol. (a) 74 (1982) 217–224.

Bondarev, V.N.; Pikhitsa, P.V., A dendrite model of current instability in RbAg4I5, Solid State Ionics 70/71 (1994) 72–76.

Boolchand, P., Th maximum in glass transition temperature (Tg) near x=1/3 in GexSe1–x Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–1978.

Boolchand, P.; Grothaus, J.; Phillips, J.C., Broken chemical order and phase separation in GexSe1–x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J. Molecular Structure of Melt–Quenched GeSe2 and GeS2 glasses compared, Proc. Int. Conf. Phys. Semicond. (Eds. Chadi and Harrison) 17$^{th}$ (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P, Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfine Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As—Te—Se glasses, J. Phys. D: Appl. Phys. 27 (1994) 2624–2627.

Chen, C.H.; Tai, K.L., Whisker growth induced by Ag photodoping in glassy GexSe1–x films, Appl. Phys. Lett. 37 (1980) 1075–1977.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemically durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1987) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag—Ge—Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panchow, A.N.; Klabund , F., The hydrogenated amorphous silicon/nanodisperse metal (SIMAL) system–Films of unique electronic properties, J. Non–Cryst. Solids 198–200 (1996) 829–832.

El Bouchiari, B.; Bernede, J.C.; Burgaud, P., Properties of Ag2+xSe1–x/n–Si diodes, Thin Solid Films 110 (1983) 107–113.

El Gharras, Z.; Bourahia, A.; Vautier, C., Role of photoinduced defects in amorphous GexSe1–x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5thin films from "in–situ" resistance measurements vs time, Phys. Stat. Sol. (a) 123 (1991) 451–460.

El–kady, Y.L., The threshold switching in semiconducting glass Ge21Se17Te62, J. Phys. 70A (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80–x films, Thin Solid Films 376 (2000) 236–240.

Fadel, M., Switching phenomenon in evaporated Se—Ge—As thin films of amorphous chalcogenide glass, Vacuum 44 (1993) 851–855.

Fadel, M.; El–Shair, H.T., Electrical, thermal and optical properties of Se75Ge7Sb18, Vacuum 43 (1992) 253–257.

Feng, X. ;Bresser, W.J.; Boolchand, P., Direct evidence for stiffness threshold in Chalcogenide classes, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behaviour of covalent glasses, J. Non–Cryst. Solids 222 (1997) 137–143.

Fischer–Colbrie, A.; Blenenstock, A.; Fuoss, P.H.; Marcus, M.A., Structure and bonding in photodiffused amorphous Ag—GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P.; Rouxel, T.; Keryvin, V.; Sangleboeuf, J.–C.; Serre, I., Lucas, J., Indentation creep of Ge—Se chalcogenide glasses below Tg: elastic recovery and non–Newtonian flow, J. Non–Cryst. Solids 298 (2002) 260–269.

Guin, J.–P.; Rouxel, T.; Sangleboeuf, J.–C.; Melscoet, I.; Lucas, J., Hardness, toughness, and scratchability of germanium–selenium chalcogenide glasses, J. Am. Ceram. Soc. 85 (2002) 1545–52.

Gupta, Y.P., On lectrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As—Se—Cu glasses, J. Apply. Phys. 54 (1983) 1950–1954.

Hajto, J.; Rose, M.J.; Osborne, LS.; Snell, A.J.; Le Comber, P.G.; Owen, A.E., Quantization effects in metal/a—Si:H/metal devices, Int. J. Electronics 73 (1992) 911–913.

Hajto, J.; Hu, J.; Snell, A.J.; Turvey, K.; Rose, M., DC and AC measurements on metal/a—Si:H/metal room temperature quantised resistance devices, J. Non–Cryst. Solids 266–269 (2000) 1958–1061.

Hajto, J.; McAuley, B.; Snell, A.J.; Owen, A.E., Theory of room temperature quantized resistance effects in metal–a—Si:H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structure, Phil. Mag. B 63 (1991) 349–369.

Hayashi, T.; Ono, Y.; Fukaya, M.; Kan, H., Polarized memory switching in amorphous Se film, Japan. J. Appl. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Hirose, Y.; Hirose, H., Polarity–dependent memory switching and behavior of Ag dendrite in Ag–photodoped amorphous As2S3 films, J. Appl. Phys. 47 (1976) 2767–2772.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1-x around the stiffness threshold composition, J. Optoelectronics and Advanced Materials 3 (2001) 199–214.

Hu, J.; Snell, A.J.; Hajto, J.; Owen, A.E., Constant current forming in Crlp+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si—V thin–film devices, Phil. Mag. B. 74 (1996) 37–50.

Hu, J.; Snell, A.J.; Hajto, J.; Owen, A.E., Current–Induced Instability in Cr–p+a–Si:H—V thin film devices, Phil. Mag. B 80 (2000) 29–43.

Iizima, S.; Sugi, M.; Kikuchi, M.; Tanaka, K., Electrical and thermal properties of semiconducting glasses As—Te—Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1966.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi, T.; Maruno, S.; Elliott, S.R., Optical, electrical, and structural properties of amorphous Ag—Ge—S and Ag—Ge—Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag photodoping in chalcogenide films, Japn. J. Appl. Phys. 26 (1987) 15–21.

Kawasaki, M.; Kawamura, J.; Nakamura, Y.; Aniya, M., Ionic conductivity of Agx(GeSe3)1-x (0<=x<=0.571) glasses, Solid state Ionics 123 (1999) 259–269.

Kluge, G.; Thomas, A.; Klabes, R.; Grotzschel, R., Silver photodiffusion in amorphous GexSe100-x, J. Non–Cryst. Solids 124 (1990) 186–193.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Koridnova, Tx.N.; Andreichin,R.E., Chalcogenide glass polarization and the type of contacts, J. Non–Cryst. Solids 194 (1995) 256–259.

Kotkata, M.F.; Afif, M.A.; Labib, H.H.; Hegab, N.A.; Abdel–Aziz, M.M., Memory switching in amorphous GeSeTi chalcogenide semiconductor films, Thin Solid films 240 (1994) 143–146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16–19.

Lai, M.; Goyal, N., Chemical bond approach to study the memory and threshold switching chalcogenide glasses, Indian Journal of pure & apl. phys. 29 (1991) 303–304.

Leimer, F.; Stotzel, H.; Kottwitz, A., Isothermal electrical polarisation of amorphous GeSe films with blocking Al contacts influenced by Pool–Frenkel conduction, Phys. Stat. Sol. (a) 29 (1975) K129–K132.

Leung, W.; Cheung, N.; Neureuther, A.R., Photoinduced diffusion of Ag in GexSe1–x glass, Appl. Phys. Lett. 46 (1985) 543–545.

Matsushita, T.; Yamagami, T.; Okuda, M., Polarized memory effect observed on Se—SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L., Reversible and irreversible electrical switching in TeO2–V2O5 based glasses, Journal de Physique IV 2 (1992) C2–185–C2–188.

Messoussi, R.; Bernede, J.C.; Benhida, S.; Abachi, T.; Latef, A., Electrical characterization of M/Se structures (M=NiBi), Mat. Chem. And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver incorporation in Ge—Se glasses used in programmable metallization cell devices, J. Non–Cryst. Solids 299–302 (1023–1027).

Miyatani, S.–y., Electronic and ionic conduction in (AgxCu1–x)2Se, J. Phys. Soc. Japan 34 (1973) 423–432.

Miyatani, S.–y., Electrical properties of Ag2Se, J. Phys. Soc. Japan 13 (1958) 317.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1–x amorphorous thin films, Jap. J. App. Phys. 15 (1976) 849–853.

Narayanan, R.A.; Asokan, S.; Kumar, A., Evidence concerning the effect of topology on el ctrical switching in chalcogenid network glasses, Phys. Rev. B 54 (1996) 4413–4415.

Neal , R.G.; Aseltine, J.A., The application f amorphous materials to computer memories, IEEE transactions on electron dev. Ed–20 (1973) 195–209.

Ovshinsky S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J; Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge—As—Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non––Cryst. Solids 8–10 (1972) 531–537.

Popov, A.I.; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge—As—Te glasses, J. Phys. D: Appl. Phys. 29 (1996) 2004–2008.

Rahman, S.; Sivarama Sastry, G., Electronic switching in Ge—Bi—Se—Te glasses, Mat. Sci. and Eng. B12 (1992) 219–222.

Ramesh, K.; Asokan, S.; Sangunni, K.S.; Gopal, E.S.R., Electrical Switching in germanium telluride glasses doped with Cu and Ag, Appl. Phys. A 69 (1999) 421–425.

Rose, M.J.;Hajto,J.;Lecomnber,P.G.;Gage,S.M.;Choi, W.K.;Snell,A.J.;Owen,A.E., Amorphous silicon analogue memory devices, J. Non–Cryst. Solids 115 (1989) 168–170.

Rose, M.J.;Snell,A.J.;Lecomber,P.G.;Hajto,J.;Fitzgerald, A.G.;Owen,A.E., Aspects of non–volatility in Si:H memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh, B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/a–13 Si:H/metal memory devices, J. Non–Cryst. Solids 137–138 (1991) 1257–1262.

Snell, A.J.; Hajto, J.;Rose, M.J.; Osborne, L.S., Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Non–Cryst. Solids 21 (1976) 319–329.

Steventon, A.G., The switching mechanisms in amorphous chalcogenide memory devices, J. Non–Cryst. Solids 21 (1976) 310–329.

Stocker, J.H., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal (??) (1972) 4609–4612.

Tichy, L.; Ticha, H., Remark on the glass–forming ability in GexSe1–x and AsxSe1–x systems, J. Non–Cryst. Solids 261 (2000) 277–281.

Titus, S.S.K.; Chatterjee, R.; Asokan, S., Electrical switching and short–range order in As—Te glasses, Phys. Rev. B 48 (1993) 14650–14652.

Tranchant,S.;Peytavin,S.;Ribes,M.;Flank,A.M.;Dexpert, H.;Lagarde,J.P., Silver chalcogenide glasses Ag—Ge—Se: ionic conduction and exafs structural investigation, Transport–structure relations in fast ion and mixed conductors Proceedings of the 6th Riso International symposium. Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda. Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As—Te—Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Parvanov,S.; Petkov,P., Electrode–limited currents in the thin–film M—GeSe—M system, Mat. Chem. And Phys. 21 (1989) 447–454.

Wang, S.–J.; Mislum, G.R.; Camp, J.C.; Chen, K.–L.; Tigelaar, H.L., High–performance Metal/silicide antifuse, IEEE electron dev. Lett. 13 (1992)471–472.

Welrauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971–2974.

West, W.C., Electrically erasable non–volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non–Cryst. Solids 151 (1992) 149–154.

Yoji Kawamoto et al.—"Ionic Conduction in $As_2S_3$–$Ag_2S$, $GeS_2$–GeS—$Ag_2S$ and $P_2S_5$–$Ag_2S$ Glasses," Journal of Non–Crystalline Solids 20 (1976), pp. 393–404.

* cited by examiner

RESISTANCE VARIABLE 'ON' MEMORY

FIELD OF THE INVENTION

The invention relates to the field of random access memory (RAM) devices formed using a resistance variable material, and in particular to the operation of resistance variable memory elements used in memory devices, for instance, programmable conductor random access memory (PCRAM) devices.

BACKGROUND OF THE INVENTION

A well known semiconductor component is semiconductor memory, such as a random access memory (RAM). RAM permits repeated read and write operations on memory elements. Typically, RAM devices are volatile, in that stored data is lost once the power source is disconnected or removed. Non-limiting examples of RAM devices include dynamic random access memory (DRAM), synchronized dynamic random access memory (SDRAM) and static random access memory (SRAM). In addition, DRAMS and SDRAMS also typically store data in capacitors which require periodic refreshing to maintain the stored data.

In recent years, the number and density of memory elements in memory devices have been increasing. Accordingly, the size of each element has been shrinking, which in the case of DRAMs also shortens the memory element's data holding time. Typically, a DRAM memory device relies on element capacity for data storage and receives a refresh command in a conventional standardized cycle, about every 100 milliseconds. However, with increasing element number and density, it is becoming more and more difficult to refresh all memory elements at least once within a refresh period. In addition, refresh operations consume power.

Recently programmable conductor memory elements have been investigated for suitability as semi-volatile and non-volatile random access memory elements. Kozicki et al. in U.S. Pat. Nos. 5,761,115; 5,896,312; 5,914,893; and 6,084,796, discloses a programmable conductor memory element including an insulating dielectric material formed of a chalcogenide glass disposed between two electrodes. A conductive material, such as silver, is incorporated into the dielectric material. The resistance of such material can be changed between high resistance and low resistance states. The programmable conductor memory is normally in a high resistance state when at rest. A write operation to a low resistance state is performed by applying a voltage potential across the two electrodes. The mechanism by which the resistance of the memory element is changed is not fully understood. In one theory suggested by Kozicki et al., the conductively-doped dielectric material undergoes a structural change at a certain applied voltage with the growth of a conductive dendrite or filament between the electrodes, effectively interconnecting the two electrodes and setting the memory element in a low resistance state. The dendrite is thought to grow through the resistance variable material in a path of least resistance.

No matter what the mechanism, the low resistance state will remain in tact for days or weeks after the voltage potentials are removed. Such material can be returned to its high resistance state by applying a reverse voltage potential between the electrodes of at least the same magnitude as used to write the memory element to the low resistance state. Again, the highly resistive state is maintained once the voltage potential is removed. This way, such a device can function, for example, as a resistance variable memory element having two resistance states, which can define two logic states.

Since the typical non-programmed state of a resistance variable memory element is the high resistance state, the memory element is programmed by an applied voltage to place the memory element into a low resistance state. To provide added memory design flexibility, it would be desirable to have a resistance variable memory element that is in a low resistance state when not programmed and which switches to a high resistance state when programed.

BRIEF SUMMARY OF THE INVENTION

The invention relates to a resistance variable memory element and a method and apparatus for stabilizing the resistance variable memory element in a non-programmed low resistance state. This is achieved in one embodiment by providing a high work function first electrode, such as a platinum electrode, on one side of a chalcogenide glass and a lower work function second electrode on an opposite side of the glass. The electrodes cause the memory element to automatically write to a predetermined state in the absence of an applied voltage. In one preferred embodiment, a platinum electrode and a silver electrode are used as the first and second electrodes to initiate and stabilize the resistance variable memory element in a non-programmed low resistance state.

BRIEF DESCRIPTION OF THE DRAWINGS

These and other features and advantages of the invention will be better understood from the following detailed description, which is provided in connection with the accompanying drawings.

DETAILED DESCRIPTION OF THE INVENTION

Figure 1:
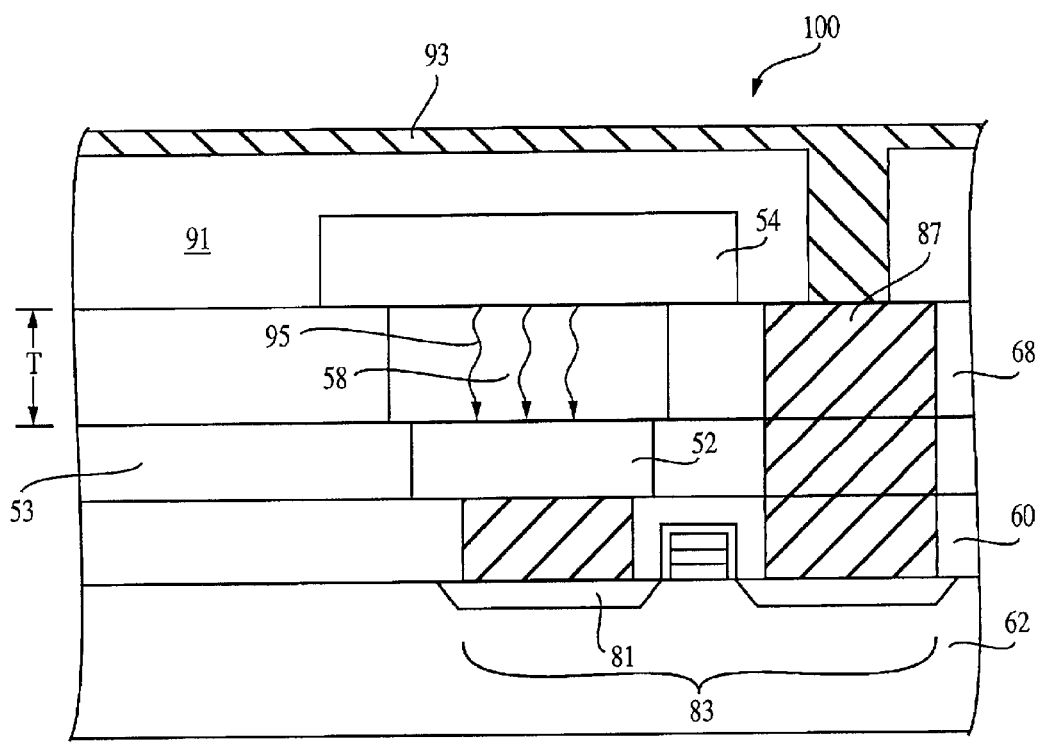
FIG. 1 is a cross-sectional view of a resistance variable memory element according to an embodiment of the invention.

In the following detailed description, reference is made to various specific embodiments of the invention. These embodiments are described with sufficient detail to enable those skilled in the art to practice the invention, and it is to be understood that other embodiments may be employed, and that various structural, logical and electrical changes may be made without departing from the spirit or scope of the invention.

The term "substrate" used in the following description may include any supporting structure, including, but not limited to, a semiconductor substrate that has an exposed substrate surface. A semiconductor substrate should be understood to include silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged. The term "platinum" is also intended to include not only elemental platinum, but platinum with other trace metals or in various alloyed combinations with other metals as known in the semiconductor industry, as long as such platinum alloy is conductive, and as long as the physical and electrical properties of the platinum remain unchanged.

The term "silver-selenide" is intended to include various species of silver-selenide, including some species which have a slight excess or deficit of silver, for instance, $Ag_2Se$, $Ag_{2+x}Se$, and $Ag_{2-x}Se$.

The term "semi-volatile memory element" is intended to include any memory element which is capable of maintaining its memory state after power is removed from the memory element for a prolonged period of time. Thus, semi-volatile memory elements are capable of retaining stored data after the power source is disconnected or removed. The term "semi-volatile memory" as used herein includes not only semi-volatile memory elements, but also non-volatile memory elements.

The term "chalcogenide glass" is intended to include glasses that comprise an element from group VIA (or group 16) of the periodic table. Group VIA elements, also referred to as chalcogens, include sulfur (S), selenium (Sc), tellurium (Te) and polonium (Po), and oxygen (O).

The term "resistance variable material" is intended to include chalcogenide glasses, and chalcogenide glasses comprising a metal, such as silver. For instance the term "resistance variable material" includes silver doped chalcogenide glasses, silver-germanium-selenide glasses, and chalcogenide glasses comprising a silver selenide layer.

The term "resistance variable memory element" is intended to include any memory element, including programmable conductor memory elements, semi-volatile memory elements, and non-volatile memory elements which exhibit a resistance change in response to an applied voltage.

The invention relates to a resistance variable memory element and a method and apparatus for turning the resistance variable memory element "on" to a low resistance state and stabilizing the resistance variable memory element in the "on" state. The invention more particularly relates to a resistance variable memory element, which incorporates a galvanic element that provides a contact potential across the resistance variable memory element to initiate the resistance variable memory element to write to the low resistance state. The electrode materials on opposite sides of the resistance variable memory element are chosen to create a contact potential between two electrodes which turn the resistance variable memory element "on" and stabilize the resistance variable memory element in an "on" or low resistance state. The resistance variable memory element of the invention may be used in memory applications as well as in creating various CMOS type circuits which may require complementary "on" and "off" devices.

The invention will be described as set forth in an exemplary embodiment illustrated in FIGS. 1–6 in the context of a random access memory. However, it should be understood that the invention may be used in other types of memory devices, in CMOS circuits and in other areas when a normally "on" device may be used. Also, other embodiments may be used and structural or logical changes may be made to the described and illustrated embodiment without departing from the spirit or the scope of the invention.

FIG. 1 illustrates an exemplary construction of a resistance variable memory element. Resistance variable memory elements 100 in accordance with the invention are generally fabricated over a substrate 62, which may be a semiconductor substrate and comprise a first insulating layer 60 formed over the substrate 62. The substrate 62 may be used to fabricate access circuitry for operating a memory device containing an array of resistance variable memory elements. A first metal electrode 52 is formed over the first insulating layer 60 and within a second insulating layer 53, a third insulating layer 68 is formed over the first electrode 52 and second insulating layer 53, and a resistance variable material 58 is disposed in an opening in the third insulating layer 68 such that the resistance variable material 58 is in contact with the first electrode 52. A second metal electrode 54 is formed over the resistance variable material 58.

The resistance variable material 58 may be formed over the first electrode 52 to dimensions (i.e., length, thickness, and width) suitable to produce desired electrical characteristics of the memory element 100. In an exemplary embodiment, the resistance variable material 58 comprises a silver-germanium-selenide chalcogenide glass. Preferably the silver-germanium-selenide chalcogenide glass composition has a GeSe stoichiometry of from about $Ge_{20}Se_{80}$ to about $Ge_{40}Se_{60}$ and more preferably has a stoichiometry of $Ge_{25}Se_{75}$. The silver concentration may vary widely, depending on the GeSe stoichiometry. Generally the silver concentration is represented by the formula $(Ge_xSe_{100-x})_{100-y}Ag_y$, wherein y typically falls somewhere in the range of about 15 to 34, and is more preferably 33.

One method of incorporating the silver into the germanium selenide material is to initially form the germanium-selenide glass and then deposit a thin layer of silver upon the glass, for example by sputtering, physical vapor deposition, or other known technique in the art. The layer of silver is irradiated, preferably with electromagnetic energy at a wavelength less than 600 nanometers, so that the energy passes through the silver and to the silver/glass interface, to break a chalcogenide bond of the chalcogenide material such that the glass is doped with silver. Alternatively, the silver can be co-sputtered with the glass composition to produce a ternary glass.

The first and second insulating layers 60, 53 may be formed of a conventional insulating oxide, such as silicon dioxide ($SiO_2$), or a low dielectric constant material such as, for example, BPSG polyimide, spin-on-polymers (SOP), parylene, flare, polyarylethers, polytetrafluoroethylene, benzocyclobutene (BCB), SILK, fluorinated silicon oxide (FSG), NANOGLASS or hydrogen silsesquioxane, among others. The invention is not limited, however, to the above-listed materials and other insulating and/or dielectric materials known in the industry may be used. The first insulating layer 60 may be formed by any known deposition methods, such as sputtering by chemical vapor deposition (CVD), plasma enhanced CVD (PECVD) or physical vapor deposition (PVD), among others.

The third insulating layer may be formed, for example, between the first electrode 52 and the second electrode 54. The second insulating layer 68 may be formed by any known deposition methods, such as sputtering, chemical vapor deposition (CVD), plasma enhanced CVD (PECVD) or physical vapor deposition (PVD), among others. The third insulating layer 68 may comprise any suitable insulating material that provides a diffusion barrier for metals, such as silver. A preferred insulating material is silicon nitride, but those skilled in the art will appreciate that there are numerous suitable insulating materials. The thickness T of the third insulating layer 68 and chalcogenide glass 58 is in the range of from about 100 Angstroms to about 10,000 Angstroms and is preferably about 500 Angstroms.

The first electrode 52 may also be electrically connected to a source/drain region 81 of an access transistor 83 which is fabricated within and on substrate 62. Another source/drain region 85 may be connected by a bit line plug 87 to a bit line of a memory array. The gate of the transistor 83 may be part of a word line which is connected to a plurality of resistance variable memory elements just as the bit line 93 may be coupled to a plurality of resistance variable memory elements through respective access transistors. This bit line 93 may be formed over a fourth insulating layer 91 and may be formed of any conductive material, for example, a metal. As shown, the bit line 93 connects to the bit line plug 87 which in turn connects with access transistor 83.

In accordance with the invention, a differential work function is used to produce an electrochemical potential across the resistance variable memory element which causes the resistance variable memory element to write to an "on" state. The differential work function is achieved by providing a first electrode 52 comprising a metal of a first work function value $V_1$, in conjunction with a second electrode 54 having a second work function value $V_2$, such that a difference in work function $\Delta_V$ between $V_1$ and $V_2$ is greater than the write potential of the resistance variable memory element $V_W$. Accordingly, $\Delta_v = (V_{1-V2}) > V_W$. Preferably, any suitable metal having a high work function may be used for the first electrode, for example platinum and iridium. The second electrode 54 preferably comprises a low work function material, such as tungsten, tantalum, or silver. The only constraint is that the difference in work functions is of sufficient magnitude to produce an electrochemical potential across the resistance variable memory element, which is sufficient to cause the resistance variable memory element to write to a low resistance "on" state.

In accordance with one preferred embodiment of the invention, the first electrode 52 is a platinum containing metal and the second electrode 54 is a silver containing metal, or vice versa, so long as a platinum electrode is used in conjunction with a silver electrode. The silver containing electrode is more preferably silver. Accordingly, silver has an affinity for platinum, which may also cause the silver to migrate towards the platinum, as represented by arrows 95, in response to the difference in work function values, which is greater than the write potential of the resistance variable memory element and sufficient to cause the resistance variable memory element to write to an "on" state.

Figure 2:
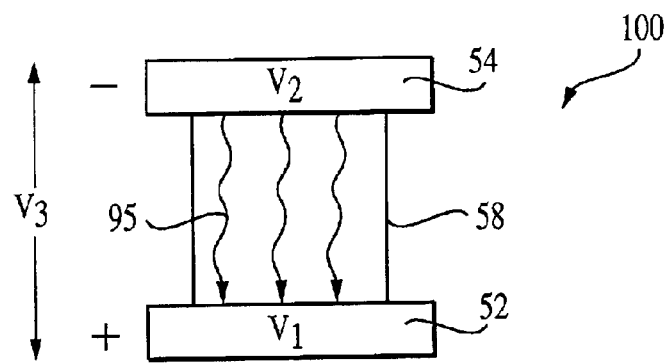
FIG. 2 is a diagram of a stabilizing circuit according to the invention.

In FIG. 2, silver migration is represented by arrows 95 indicating that the conductor having a higher work function potential $V_1$, e.g., platinum, is provided for the first electrode 52 and the material having a lower work function potential $V_2$, e.g., silver, is provided for the second electrode 54; however, as noted these can be reversed.

As also shown in FIG. 2, when an electrode 52, having a high work function value $V_1$ is coupled with an electrode 54, having a low work function value $V_2$, the resistance variable memory element may be spontaneously stabilized in the "on" state. In other words, the resistance variable memory element 100 automatically turns to an "on" or low resistance state. In its "on" state, the resistance variable memory element is undisturbed and typically has a low resistance of 20,000 ohms or less. Unless disturbed by application of a voltage across the electrodes 52, 54, the resistance variable memory element will stay in this "on" state.

"Work function" is the amount of energy required to move an electron from the bulk of a material to an infinite distance away (the vacuum). The work function is also defined as the energy distance between the vacuum level and the Fermi level of a material. The work function value can be used to gauge the resistance of a particular material to current flow. The direction in which silver tends to cross the resistance variable material 58 is controlled by the electrochemical difference between the high work function electrode and the low work function electrode. While not wishing to be bound to any specific theory, it is believed that because the work functions of the electrodes are different, there is a preferred direction of electrode tunneling, which causes the resistance variable memory sift element to write to a predetermined state. Thus, the differential electrochemical potential draws silver from the low work function metal towards the high work function metal.

Referring again to FIG. 2, a resistance variable memory element 100 is turned "on" by the difference in work functions of the materials for electrodes 52 and 54. The difference in work functions is sufficient to generate a voltage $V_3$ across the resistance variable memory element that causes the resistance variable memory element to self-write to an "on" state. It has been observed that a voltage $V_3$ as low as 0.15 volts may be sufficient for this purpose.

Figure 3:
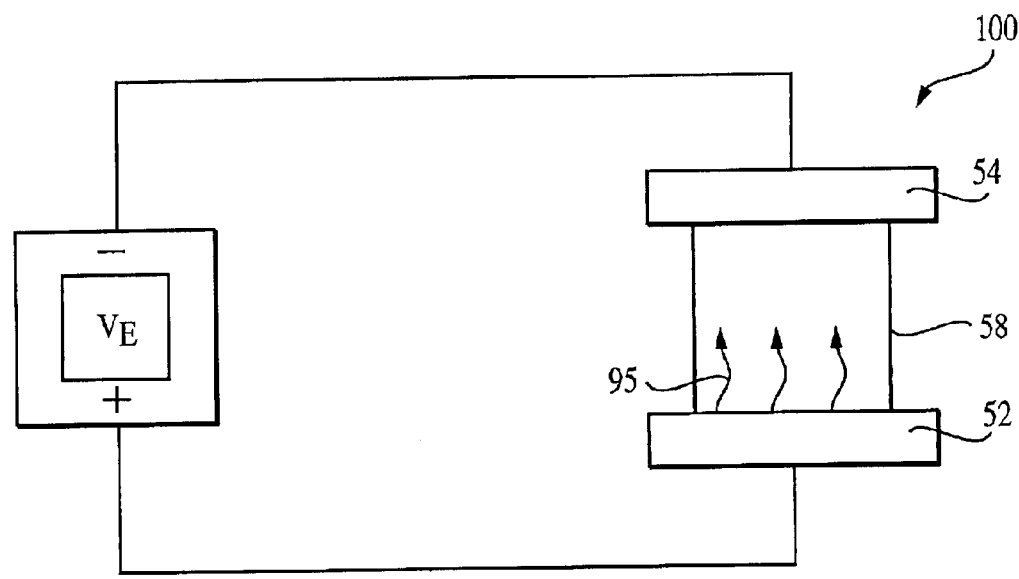
FIG. 3 is a diagram of a program circuit according to the invention.

Referring now to FIG. 3, a resistance variable memory element may be erased to an "off," high resistance state, by applying a reverse voltage to the resistance variable memory element 100 which has an absolute magnitude which exceeds that of $V_3$. It has been observed that a negative voltage, more negative than −0.15 volts, is typically sufficient. The negative bias causes the resistance variable memory element 100 to erase to a high resistance state, i.e., greater than 20,000 ohms, and preferably greater than 100,000 ohms. An exemplary method of erasing the resistance variable memory element 100 would include applying a voltage $V_E$ of −0.15 volts to cause the resistance variable memory element to erase as shown in FIG. 3. In this way a resistance variable memory element may store a binary value as one of the two "on" and "off" resistance states of the resistance variable memory element.

Referring again to FIG. 3, since the resistance variable memory element 100 self-writes to a low resistance "on" state, all resistance variable memory elements in an array will naturally erase to the "on" state. Any resistance variable memory elements which are written to an "off" state by the application of a negative voltage having an absolute value greater than that of the electrochemnical potential $V_1$ must be maintained in the "off" state by a periodic refresh voltage.

Figure 4:
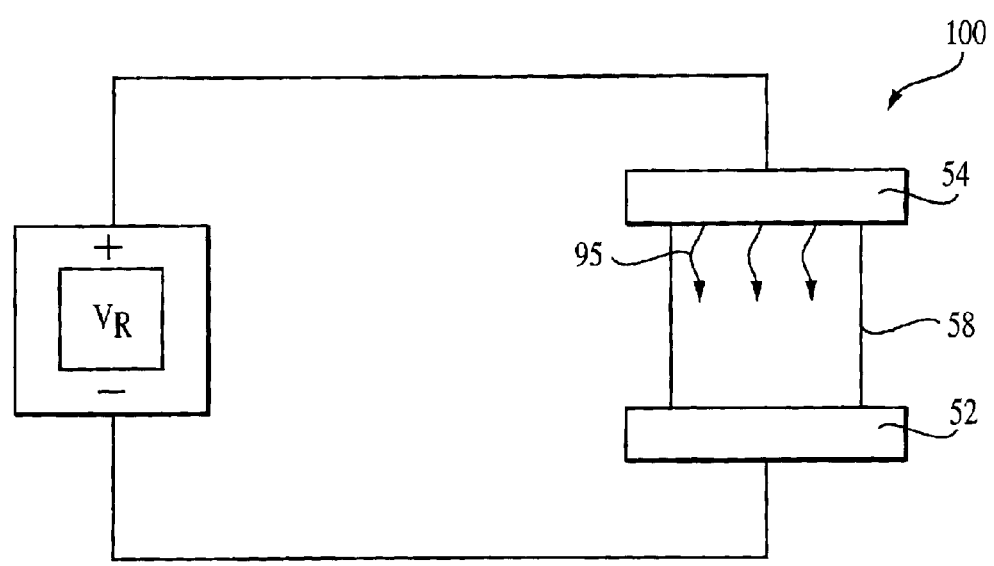
FIG. 4 is a diagram of an erase circuit according to the present invention.

Although, a resistance variable memory element constructed in accordance with the invention can retain a stable "on" state without application of an external voltage, an external voltage is required to both write a resistance variable memory element to the "off" state and to maintain a resistance variable memory element in the "off" state. However, since it is sufficient to merely set up a negative voltage electric field to cause an "off" resistance variable memory element to maintain a high resistance "off" state, negligible current flows during a refresh or write operation, so less current or power is required to refresh a resistance variable memory element than is typically encountered to refresh a DRAM element. As shown in FIG. 4, a refresh can be obtained by reverse biasing an "off" resistance variable memory element at a voltage $V_R$, and/or duration, below the self-"on" threshold voltage $V_3$ of the resistance variable memory element. Thus, a resistance variable memory element written to the high resistance state by about 0.15 volts would be refreshed using −0.12 volts. Since the refresh voltage is supplied to all resistance variable memory elements simultaneously, the −0.12 volts are insufficient to turn "off" an "on" resistance variable memory element, but is sufficient to prevent an "off" resistance variable memory element from reverting to an "on" state.

Figure 5:
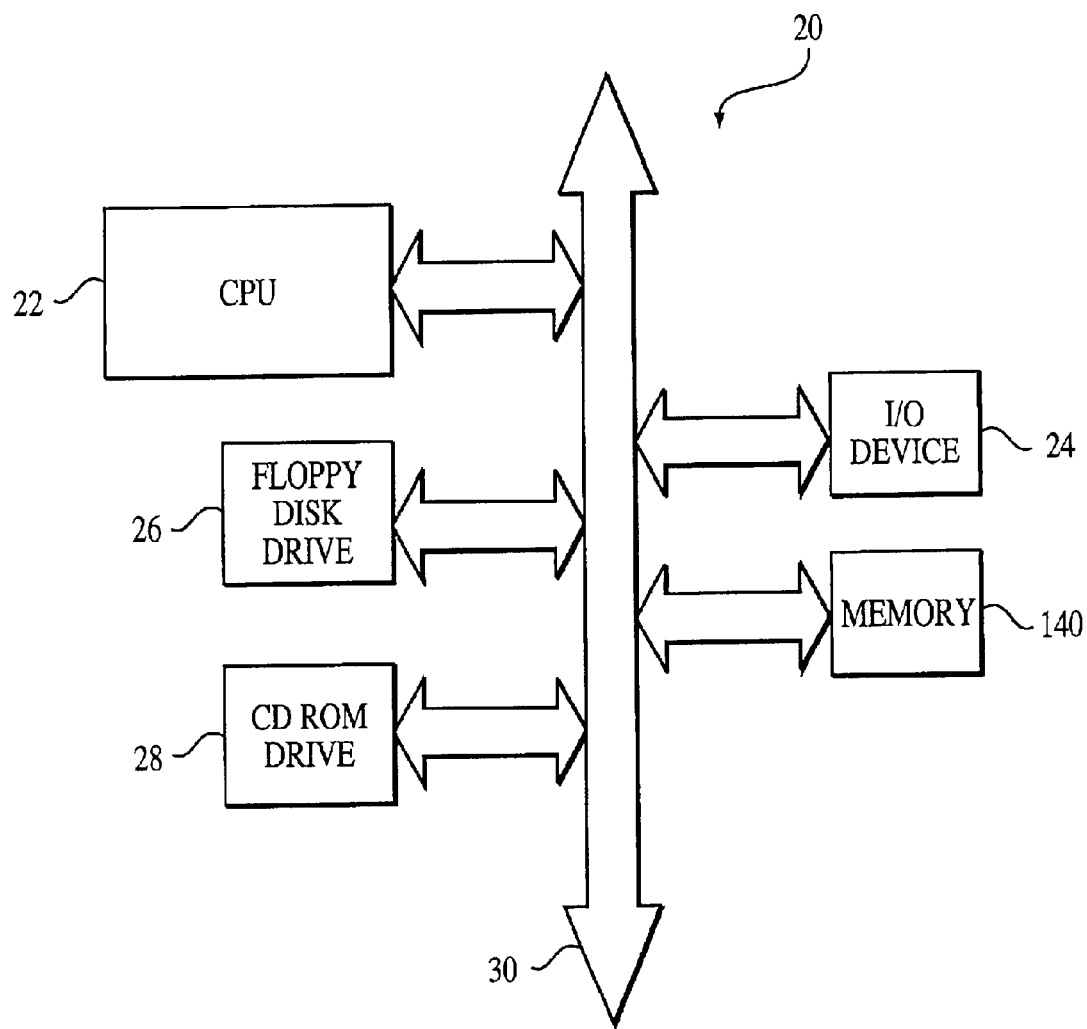
FIG. 5 illustrates a computer system having one or more memory devices that contains resistance variable memory elements according to the invention.

FIG. 5 is a block diagram of an exemplary processor system 20 that includes a memory circuit 140. The memory circuit 140 includes one or more integrated circuit memory devices containing resistance variable memory elements. A processor system, such as a computer system, generally comprises a central processing unit (CPU) 22, such as a microprocessor, a digital signal processor, or other programmable digital logic device, which communicates directly or indirectly with one or more input/output (I/O) devices 26 over one or more buses 30. The memory circuit 140 communicates with the central processing unit 22 directly or through a memory conductor and over one or more busses 30.

In the case of a computer system, the processor system may include peripheral devices such as a floppy disk drive 26 and a compact disk read only memory (CD ROM) drive 28, which also communicate with CPU 22 over the bus 30. Memory circuit 140 is preferably constructed as one or more integrated circuit memory devices, each of which includes one or more resistance variable memory elements 100 (FIG. 2) and which is coupled to CPU 22. If desired, the memory circuit 140 may be combined with the processor, for example CPU 22, in a single integrated circuit. Although one architecture for a computer system is illustrated in FIG. 5, it should be understood that this is merely exemplary of many computer architectures which may employ a memory circuit 140 employing resistance variable memory elements in accordance with the invention.

Although the embodiments described above refer to the formation of only one resistance variable memory element 100, it should be understood that the invention contemplates the formation of any number of such resistance variable memory elements, which can be formed as one or more resistance variable memory element arrays.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description of the drawing, but is only limited by the scope of the appended claims.

What is claimed as new and desired to be protected by Letters Patent of the United States is:

1. A memory element comprising:
a resistance variable material; and
first and second electrodes connected to said resistance variable material, said first and second electrodes comprising materials capable of stabilizing said element in a low resistance state.

2. The memory element of claim 1 wherein said resistance variable material includes silver.

3. The memory element of claim 1 wherein said resistance variable material comprises a chalcogenide glass.

4. A memory element comprising:
a resistance variable material; and
first and second electrodes connected to said resistance variable material, said first and second electrodes comprising materials capable of providing an electrochemical potential across said element which causes said element to write to a predetermined low resistance state.

5. The memory element of claim 4 wherein said resistance variable material includes silver.

6. The memory element of claim 4 wherein said resistance variable material comprises a chalcogenide glass.

7. A memory element comprising:
a resistance variable material; and
a first electrode and a second electrode connected to said resistance variable material wherein said first electrode comprises of a first material having a first work function value and said second electrode comprises a second material having a second work function value such that a difference in work function values between said first work function value and said second work function value is greater than a write potential of said element.

8. The memory element of claim 7 wherein said difference between work function values is sufficient to stabilize said element in a low resistance state.

9. The memory element of claim 7 wherein said first material comprises platinum.

10. The memory element of claim 7 wherein said first material comprises iridium.

11. The memory element of claim 7 wherein said second material comprises silver.

12. The memory element of claim 7 wherein said second material comprises tungsten.

13. The memory element of claim 7 wherein said second material comprises tantalum.

14. The memory element of claim 7 wherein said first electrode comprises a platinum electrode and said second electrode comprises a silver electrode.

15. The memory element of claim 7 wherein said resistance variable material comprises a chalcogenide glass.

16. The memory element of claim 15 wherein said chalcogenide glass comprises a GeSe composition.

17. The memory element of claim 16 wherein said GeSe composition stoichiometry is in the range of about $Ge_{20}Se_{80}$ to about $Ge_{40}Se_{60}$.

18. The memory element of claim 16 wherein said GeSe composition stoichiometry is about $Ge_{25}Se_{75}$.

19. The memory element of claim 15 wherein said resistance variable material includes silver.

20. A memory element comprising:
a resistance variable material;
a first electrode connected to said chalcogenide glass; and
a second electrode connected to said chalcogenide glass said first and second electrodes being formed of predetermined materials which cause said element to turn on spontaneously.

21. The memory element of claim 20 further wherein said element returns to an on state after said element is erased.

22. A memory element comprising:
a resistance variable material;
a first electrode connected to said resistance variable material;
a second electrode connected to said resistance variable material; and
said first and second electrode being formed of materials which cause said element to move to a low resistance state.

23. A memory element comprising:
a first conductive element;
a resistance variable material; and
a second conductive element, said first and second conductive elements providing a differential electrochemical potential for stabilizing said memory element in a predetermined lower resistance state.

24. The memory element of claim 23 wherein said differential electrochemical potential is a result of a difference in work functions between said first and second conductive elements.

25. The memory element of claim 23 wherein said resistance variable material comprises a chalcogenide glass.

26. The memory element of claim 25 wherein said chalcogenide glass comprises a GeSe composition.

27. The memory element of claim 26 wherein said GeSe composition stoichiometry is from about $Ge_{20}Se_{80}$ to about $Ge_{40}Se_{60}$.

28. The memory element of claim 27 wherein said GeSe composition stoichiometry is about $Ge_{25}Se_{75}$.

29. The memory element of claim 23 wherein said first conductive element comprises platinum.

30. The memory element of claim 29 wherein said second conductive element comprises silver.

31. The memory element of claim 23 wherein said second conductive element comprises tungsten.

32. The memory element of claim 23 wherein said second conductive element comprises silver.

33. The memory element of claim 23 wherein said second conductive element comprises tantalum.

34. The memory element of claim 23 wherein said chalcogenide glass includes silver.

35. A memory element comprising:
a resistance variable material;
a first electrode connected to said resistance variable material;
a second electrode connected to said resistance variable material;
said first and second electrodes providing a differential electrochemical potential for stabilizing said memory element in an at rest low resistance state;
a first circuit for applying a programming voltage across said first and second electrodes to program said memory element from said at rest low resistance state to a second high resistance state; and
a second circuit for applying a refresh voltage across said first and second electrodes to maintain said element at said high resistance state.

36. The memory element of claim 35 wherein said first electrode comprises platinum.

37. The memory element of claim 36 wherein said second electrode comprises silver.

38. The memory element of claim 36 wherein said second electrode comprises tungsten.

39. The memory element of claim 36 wherein said second electrode comprises tantalum.

40. The memory element of claim 35 wherein said resistance variable material comprises a chalcogenide glass.

41. The memory element of claim 40 wherein said chalcogenide glass comprises a GeSe composition.

42. The memory element of claim 41 wherein said GeSe composition stoichiometry is from about $Ge_{20}Se_{80}$ to about $Ge_{40}Se_{60}$.

43. The memory element of claim 42 wherein said GeSe composition stoichiometry is about $Ge_{25}Se_{75}$.

44. The memory element of claim 41 wherein said GeSe composition comprises silver.

45. A method for operating a resistance variable memory element, said method comprising the step of:
forming a differential electrochemical potential across a resistance variable material with electrodes connected to said resistance variable material, said potential sufficient to cause said resistance variable memory element to write to an on state.

46. A method for stabilizing a memory element said method comprising the steps of:
providing a resistance variable material; and
providing a first electrode and a second electrode on said resistance variable material each having a different work function value, wherein said difference in said work function values causes said memory element to write to a predetermined on state.

47. The method of claim 46 wherein said predetermined on state is maintained via said difference in said work function values.

48. The method of claim 46 wherein said first electrode comprises platinum.

49. The method of claim 48 wherein said second electrode comprises silver.

50. The method of claim 46 wherein said second electrode comprises nickel.

51. The method of claim 46 wherein said second electrode comprises silver.

52. The method of claim 46 wherein said second electrode comprises tungsten.

53. The method of claim 46 wherein said second electrode comprises tantalum.

54. The method of claim 46 wherein said resistance variable material comprises a chalcogenide glass.

55. The method of claim 54 wherein said chalcogenide glass comprises a GeSe composition.

56. The method of claim 55 wherein said GeSe composition stoichiometry is from about $Ge_{20}Se_{80}$ to about $Ge_{40}Se_{60}$.

57. The method of claim 56 wherein said GeSe composition stoichiometry is about $Ge_{25}Se_{75}$.

58. The method of claim 54 wherein said chalcogenide glass includes silver.

59. A method of stabilizing a resistance variable memory element having a first electrode and a second electrode connected to a chalcogenide glass said method comprising the steps of:
forming said second electrode from a platinum material; and
providing a differential electrochemical potential between said first electrode and said second electrode to stabilize said element in a low resistance state.

60. A method of forming a memory element comprising:
providing a first electrode comprising a first material in contact with a resistance variable material;
providing a second electrode comprising a second material in contact with said resistance variable material; and
said first and second material compositions of said first and second electrodes providing an electrochemical potential across said resistance variable material sufficient to place said resistance variable material in a stable low resistance state.

61. The method of claim 60 wherein said first electrode material is platinum.

62. The method of claim 61 wherein said second electrode material is silver.

63. The method of claim 61 wherein said second electrode material is tungsten.

64. The method of claim 61 wherein said second electrode material is tantalum.

65. A method of stabilizing a resistance variable memory element having a first electrode and a second electrode comprising the steps of:
   providing a difference in work functions of each said first and second electrodes;
   providing an electrochemical potential across said resistance variable memory element with said first and second electrodes which places said resistance variable memory element in a low resistance state; and
   said electrochemical potential restoring said resistance variable memory element to said low resistance state after said resistance variable memory element is placed in a high resistance state.

66. A method of operating a resistance variable memory element comprising the steps of:
   stabilizing said resistance variable memory element to an at rest low resistance state by utilizing a difference in work function between a first and a second electrode of said resistance variable memory element;
   applying a first voltage across said first electrode and said second electrode to program said resistance variable memory element from said at rest low resistance to a second high resistance state; and
   applying a second voltage across said first electrode and said second electrode to maintain said resistance variable memory element at said high resistance state.

67. A method for operating a memory element comprising the steps of:
   providing a silver electrode and a platinum electrode on a chalcogenide glass to produce an electrochemical potential which causes said glass to attain a low resistance state; and
   applying a voltage to said element to write said element to a high resistance state.

68. A method of operating a memory element having a first and second electrode comprising the steps of:
   providing a platinum electrode in contact with a resistance variable material;
   providing a silver electrode in contact with said resistance variable material; and
   stabilizing said element in a low resistance state using electrochemical properties of said second silver electrode and said first platinum electrode.

69. The method of claim 68 wherein said resistance variable material comprises a GeSe composition.

70. The method of claim 69 wherein said GeSe composition stoichiometry is from about $Ge_{20}Se_{80}$ to about $Ge_{40}Se_{60}$.

71. The method of claim 70 wherein said GeSe composition stoichiometry is about $Ge_{25}Se_{75}$.

72. The method of claim 68 wherein said resistance variable material comprises silver.

73. A method of operating a memory element comprising the steps of:
   providing a first electrode and second electrode comprising material capable of establishing an electrochemical potential across said memory element; and
   applying a first voltage across said first and second electrodes, said first voltage having a polarity inverse to that of said electrochemical potential created across said memory element and said first voltage having an absolute magnitude greater than an absolute magnitude of said electrochemical potential.

74. The method of claim 73 further comprising the step of applying a second voltage across said first and second electrodes, said second voltage having a polarity inverse to said first voltage and said second voltage having an absolute magnitude less than said absolute magnitude of said electrochemical potential.

75. The memory element of claim 23 wherein said first conductive element comprises iridium.

76. The memory element of claim 37 wherein said first conductive element comprises iridium.

77. The memory element of claim 46 wherein said first conductive element comprises iridium.

* * * * *